United States Patent [19]

Schirmer et al.

[11] Patent Number: 5,311,398
[45] Date of Patent: May 10, 1994

[54] HOUSING FOR MOTOR VEHICLE ELECTRONIC SYSTEM

[75] Inventors: Klaus Schirmer, Ingoldstadt; Jochen Burgdorf, Offenbach-Rumpenheim; Heinz Loreck, Idstein, all of Fed. Rep. of Germany

[73] Assignees: Telefunken Electronic GmbH, Heilbronn; Alfred Teves GmbH, Frankfurt am Main, both of Fed. Rep. of Germany

[21] Appl. No.: 941,093
[22] PCT Filed: Jan. 9, 1992
[86] PCT No.: PCT/EP92/00027
  § 371 Date: Oct. 28, 1992
  § 102(e) Date: Oct. 28, 1992
[87] PCT Pub. No.: WO92/12875
  PCT Pub. Date: Aug. 6, 1992

[30] Foreign Application Priority Data

Jan. 26, 1991 [DE] Fed. Rep. of Germany ....... 4102265

[51] Int. Cl.$^5$ ............................................. H05K 7/20
[52] U.S. Cl. .................................. 361/704; 174/52.2; 257/713; 361/707
[58] Field of Search ............ 123/1 R, 198 RE; 307/10.1; 439/65, 485, 606, 620, 637; 174/252, 260, 16.1, 52.2; 252/706, 703, 712, 713; 165/80.3, 185; 361/380, 382, 386–388, 395, 398, 399, 413, 689, 704, 705, 707, 711, 719, 720, 736, 749, 785

[56] References Cited

U.S. PATENT DOCUMENTS

| | | |
|---|---|---|
| 3,996,914 | 12/1976 | Crall et al. . |
| 4,050,093 | 9/1977 | Crall et al. . |
| 4,130,856 | 12/1978 | Crall et al. . |
| 4,149,220 | 4/1979 | Crall et al. . |
| 4,444,452 | 4/1984 | Hilbrandt et al. . |
| 4,547,834 | 10/1985 | Dumont .............................. 361/386 |
| 4,658,330 | 4/1987 | Berg .................................. 361/386 |
| 4,858,073 | 8/1989 | Gregory ............................ 361/388 |
| 4,879,630 | 11/1989 | Boucard ............................ 361/386 |
| 4,899,256 | 2/1990 | Sway-Tin ........................... 361/399 |
| 4,905,123 | 2/1990 | Windle ............................... 361/388 |
| 4,953,060 | 8/1990 | Lauffer .............................. 361/388 |
| 5,053,923 | 10/1991 | Niemetz . |
| 5,103,375 | 4/1992 | Cottingham ....................... 361/386 |

FOREIGN PATENT DOCUMENTS 2626328 12/1976 Fed. Rep. of Germany .
3837974 5/1990 Fed. Rep. of Germany .

Primary Examiner—Gerald P. Tolin
Attorney, Agent, or Firm—Spencer, Frank & Schneider

[57] ABSTRACT

A housing for installation in motor vehicles to accommodate SMD electronic components disposed on one side of a multi-layer circuit board or film. A metal plate serves as the carrier for the circuit board or film, with the planar expanse of the metal plate being the same as or greater than that of the board or film, with the board or film being disposed on, attached to and electrically insulated from the metal plate. When the area of the metal plate is greater than that of the board or film, power components are disposed on the surface of the metal plate in a region not covered by the board or film, whereas when the area of the metal plate is substantially the same as that of the board or film, power components are disposed on the board or film, with the metal plate serving as a heat sink for the power components. A connector is mounted on the metal plate in a region covered by the board or film such that the connection pins of the connector are brought into the board or film, with the coupling side of the connector being on the planar side of the metal plate which is opposite the side carrying the board or film. Finally, a mechanical cover arrangement is attached to the metal plate to form a flat housing, with the mechanical cover arrangement covering the surface side of the metal plate carrying the board or film.

17 Claims, 3 Drawing Sheets

HOUSING FOR MOTOR VEHICLE ELECTRONIC SYSTEM

BACKGROUND OF THE INVENTION

The invention relates to a housing for installation in motor vehicles in order to accommodate electronic components.

Electronic control and regulating systems are increasingly employed in motor vehicles. Their components are accommodated in housings which sufficiently protect them against the stresses and interferences occurring during operation. Such housings are partially or completely constructed as metal housings so as to suppress electromagnetic interferences (EMC* interferences). At the same time, such a metal housing serves to dissipate the heat generated by the electrical power so that the electronic components can function properly at an ambient temperature of −40° C. to 120° C., for example, by the additional use of cooling fins.

*Translator's Note: EMC=electromagnetic compatibility

This requirement for temperature resistance together with the requirement that the housing be tight makes the overall housing suitable for the engine area. In order to meet all of these requirements, complicated structures are often provided for such housings which also results in high manufacturing costs.

SUMMARY OF THE INVENTION

It is therefore the object of the invention to provide a housing of the above-mentioned type which has a simple structure and thus can be manufactured economically.

A first embodiment of the invention comprises a multi-layer circuit board or a multi-layer film which, on one side, is equipped with SMD components and a metal plate as the carrier for the multi-layer circuit board or film, with the planar expanse of the metal plate being greater than the planar expanse of the multi-layer circuit board or film, wherein the multi-layer circuit board or film is disposed on, attached to and insulated from the metal plate. The invention further comprises power components disposed on the surface of the metal plate in a region not covered by the multi-layer circuit board or film with the metal plate serving as a heat sink for the power components; a connector mounted on the metal plate in a region covered by the multi-layer circuit board or film such that the connection pins of the connector are brought into the multi-layer circuit board or film and the coupling side of the connector lies on the planar side of the metal plate which is opposite the side carrying the multi-layer circuit board or film; and mechanical cover means which are attached to the metal plate to form a flat housing, in which the mechanical cover means cover the side of the metal plate carrying the multi-layer circuit board or film.

A second embodiment of the invention comprises a multi-layer film which, on one side, is equipped with SMD components and a metal plate as the carrier for the multi-layer film, with the planar expanse of the metal plate having a similar shape and size to the planar expanse of the multi-layer film, wherein the multi-layer circuit board or film is disposed on, attached to and insulated from the metal plate. The invention further comprises a connector mounted to the metal plate such that the connection pins of the connector are brought through a passage in the metal plate and into the multi-layer film, and a region of the multi-layer film carrying these connection pins divides the surface of the film into a first region and a second region, with the coupling side of the connector lying on the planar side of the metal plate opposite the side carrying the multi-layer film; power components disposed on the first region of the multi-layer film; and mechanical cover means attached to the metal plate to form a flat housing, in which the mechanical means only covers the side of the metal plate carrying the multi-layer circuit board or film.

The metal plate provided according to the invention serves, on the one hand, as a carrier for the multi-layer circuit board or multi-layer film and the power components and thus function as a heat sink. On the other hand, the metal plate also serve as part of the housing. In this way, it is possible to automatically equip the multi-layer circuit board or the multi-layer film with the SMD (Surface Mount Device) components and the power components as well as to equip the metal plate with the power components. It is particularly advantageous to mechanically mount the connector on the metal plate, with the connecting pins for this connector being simultaneously brought to the multi-layer circuit board or multi-layer film. Further wiring to connect the connector with the circuit board is thus not required. By using a multi-layer circuit board, it is possible to realize a degree of coverage of about 85%. This housing according to the invention therefore has a simple and compact structure. It is possible to manufacture the housing fully automatically with the result that the manufacturing costs can also be kept low.

In a preferred embodiment of the invention, the connector is disposed at an advantageous location, namely at the point where it is in the immediate vicinity of the power components. Thus it is possible, for example, for the connector to spatially separate the power components from the SMD components that are part of the electronic control system. With this position of the connector, it is possible to make the leads for the power components as short as possible, thus saving surface area on the circuit board and additionally reducing sensitivity to interference since other signal paths are no longer directly adjacent to the power components.

According to a particularly advantageous feature of the invention, the metal plate is of rectangular shape and has a length and a width, with the shape of the multi-layer circuit board being selected in such a way, that its length almost corresponds to the length of the metal plate and its width is less than that of the metal plate by a predetermined amount so that the resulting rectangular area is sufficient to accommodate the power components. In this way, it is possible to arrange the connector in the immediate vicinity of these power components, thus minimizing the length f the connecting leads for these power components.

In another preferred embodiment of the invention the metal plate and the multi-layer film are configured in a rectangular shape, each having the same length and width. In this case, if a thin, unilaterally copper laminated multi-layer film is employed, the power components can be soldered to the film.

In a further embodiment the invention, the connector is brought over the entire length of the metal plate and is provided at its narrow end faces with flange members that project beyond the metal plate so that it is easy to install the housing in the motor vehicle and the connecting forces are directly dissipated to the fastening points.

In another advantageous embodiment of the invention, the direction of coupling of the connector may be perpendicular to the metal plate. Alternatively, a particularly advantageous connector configuration can also be realized if the coupling direction extends parallel to the planar expanse of the metal plate. This results in a structure having a particularly compact configuration.

In order to make the housing according to the invention suitable for use in the engine area, the connector is mounted mechanically tightly onto the metal plate by fastening means.

A measure supporting the simple structure of the housing according to the invention resides in the power components being glued to the metal plate in an electrically insulating manner or being soldered to the multi-layer film in good thermal contact with the metal plate.

Finally, the metal plate which carries the multi-layer circuit board or the multi-layer film, the power components and the connector can be completed into a full housing by covering the metal plate with a mechanical means. In one embodiment of the invention, the mechanical mans comprises a hood-shaped cover, form-lockingly covering the side of the metal surface equipped with the circuit board or film. In another embodiment of the invention, a cast seal in the form of a partial or complete encasement may be provided instead of the cover.

BRIEF DESCRIPTION OF THE DRAWINGS

The invention will now be described in greater detail with reference to embodiments thereof and in conjunction with the drawing figures, in which.

In the drawings corresponding components bear the same reference numerals.

DETAILED DESCRIPTION OF THE PREFERRED EMBODIMENTS

Figure 1:
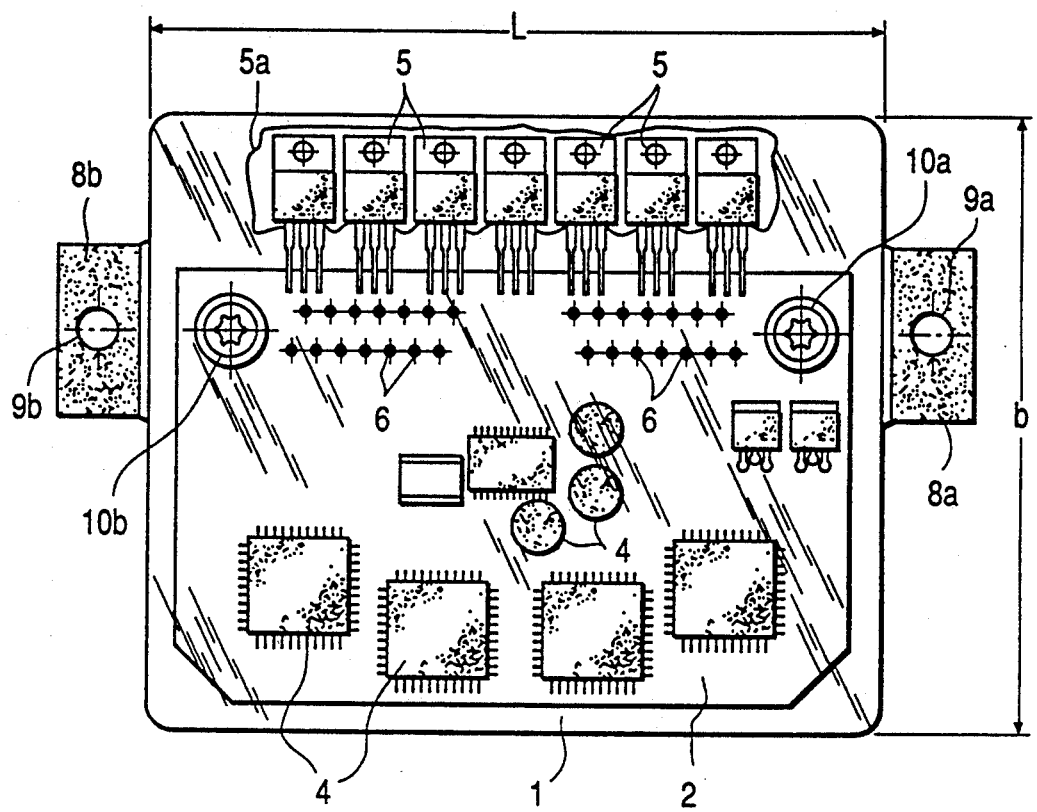
FIG. 1 is a top view of the metal plate carrying the components of a first embodiment of the housing according to the invention.
Figure 2:
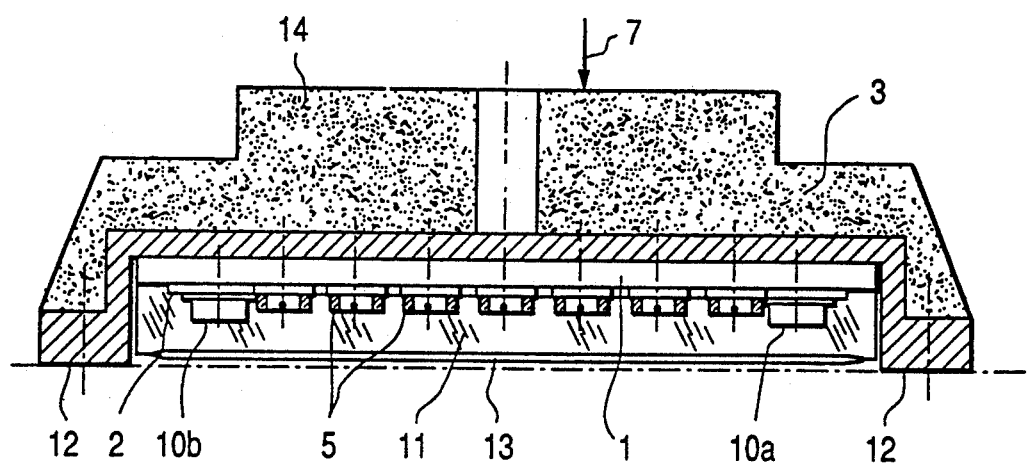
FIG. 2 is a side view of the embodiment of FIG. 1 looking onto the long side of the connector.

In FIG. 1 and FIG. 2, the reference numerals 1, 2 and 3 identify a solid metal plate, a multi-layer circuit board and a connector respectively. Instead of the multi-layer circuit board, a multi-layer film may also be employed. Metal plate 1 is configured, for example, of a rectangular piece of aluminum which has a length l of 120 mm and a width b of 100 mm. A circuit board 2 having almost exactly the same length l except for an edge of about 2 mm and a width which is less than the width of metal plate 1 is glued in a surface-locking manner to this circuit board 1 in an electrically insulating manner so that one long edge of the multi-layer circuit board 2 terminates flush with the long edge of metal plate 1 except for an edge of about 2 mm. Due to the fact the multi-layer circuit board 2 is narrower than metal plate 1, the rectangular surface created on the opposite side of metal plate 1 where it is not covered by multi-layer circuit board 2 is able to accommodate power components for example power transistors 5, which are glued on to metal plate 1 in an electrically insulating manner by means of an adhesive 5a. Multi-layer circuit board 2 is manufactured in SMD technology, that is, it is equipped with SMD components 4.

Figure 5:
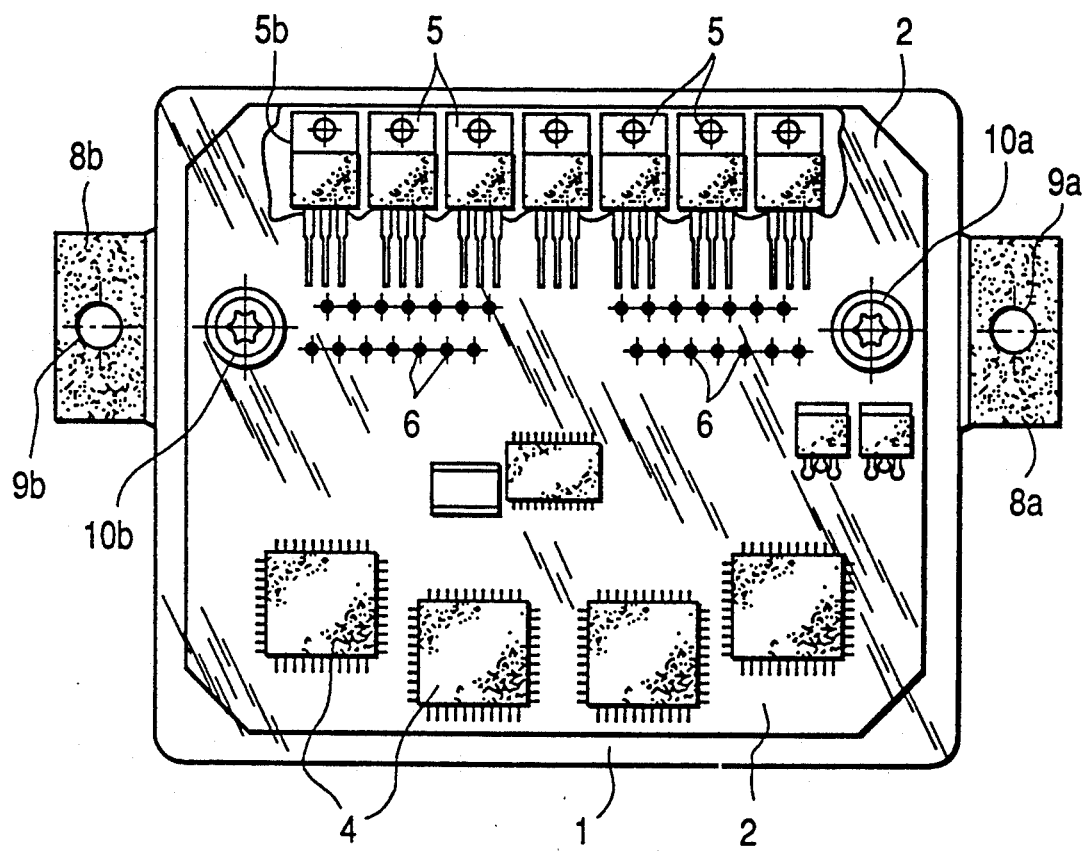
FIG. 5 is a top view of a second embodiment of the invention.

In the housing according to FIG. 5, a multi-layer film 2, for example, of polyimide or equivalent, high temperature resistant, flexible substrates (non-woven fabric, glass, silk, etc.) is employed instead of the multi-layer circuit board. In this case, however, the size of this multi-layer film 2 corresponds to the size of metal plate 1. In this embodiment as well, power components 5 are arranged in a row along one long side as in the embodiment according to FIG. 1. In order to secure good thermal contact with metal plate 1, a thin multi-layer film 2 is employed which is copper laminated on one side. The power components 5 are soldered by means of solder 5b onto this copper laminated surface. Otherwise, the structure corresponds to that of FIG. 1.

Due to this configuration according to FIGS. 1 and 5,, metal plate 1 not only serves as a carrier for multi-layer circuit board 2 or multi-layer film 2, respectively, and for power transistors 5, it also acts as a heat sink for these components.

In the embodiment according to FIGS. 1 and 2, the 28-pin connector 3 is placed in the longitudinal direction of metal plate 1 and directly adjacent to power transistors 5 over metal plate 1 and is mechanically connected with it by means of screw connections 10a and 10b. According to FIG. 1, this connector 3 is disposed in the edge region of multi-layer circuit board 2 adjacent to power transistors 5, so that its connector pins 6 can be brought to this multi-layer circuit board 2 in order to establish an electrical connection. According to FIG. 5 as well, connector pins 6 are brought to multi-layer film 2 where they are soldered on. All SMD components 4 can now be soldered in a single soldering step. In order to be able to bring the connector pins 6 of connector 3 to film 2, an appropriate passage is made on the metal plate 1 of FIG. 1 and FIG. 5.

Connector 3 is provided with flange members 8a and 8b which project beyond the edge of metal plate 1 and are each provided with a bore 9a and 9b. By means of these bores 9a and 9b, the finished housing can be installed in the motor vehicle at the location provided for this purpose. According to FIG. 2, the two flange members 8a and 8b must project beyond the surface of metal plate 1 that carries components 4 and 5 to such an extent that its installation surface 12 is either flush with the surface 13 of the member 11 which covers components 4 and 5 or at least projects beyond this surface 13.

Figure 3:
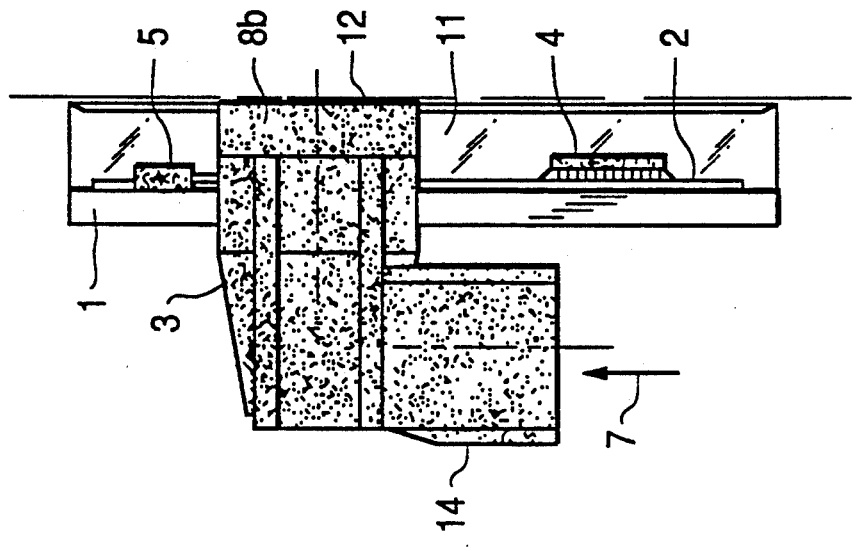
FIG. 3 is a side view of the embodiment of FIG. 1 looking onto the narrow side of the connector.
Figure 4:
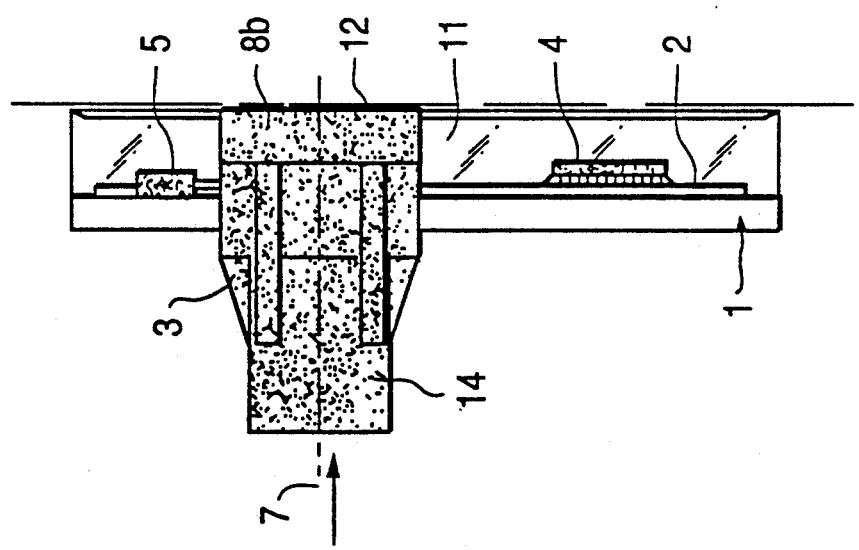
FIG. 4 is a side view of a second embodiment of the invention showing a right angled coupling member of the connector.

Finally, metal plate 1 also functions as part of the housing. The remainder of the housing is realized in that the multi-layer circuit board 2 or the multi-layer film 2 as well as power transistors 5 are encased by mechanical means encasing material in such a way that, according to FIG. 2, only the side of metal plate 1 carrying multi-layer circuit board 2 or multi-layer film 2 is covered, with this full encasement together with metal plate 1 forming a flat, block-shaped structure as shown in FIG. 2. This structure has a thickness of, for example, approximately 12 mm. On the free side of metal plate 1, only the coupling member 14 of the connector 3 is visible. According to FIGS. 2 and 3, its coupling direction (see arrow 7) is perpendicular to metal plate 1. The total thickness of the arrangement according to FIG. 1, excluding the projection caused by coupling member 14 of connector 3, is a mere 45 mm. Instead of completely encasing the housing, it may be encased only partially, in which case a plastic cover will be clipped on as a closure. This is an even more economical solution compared as to the complete encasement. The electronic components are encased in order to cover them and protect them against moisture and corrosion;

The embodiment according to FIG. 4 differs from that according to FIG. 1 or 2 only in the configuration of connector 3. FIG. 4 is merely a side view corresponding to FIG. 3 onto the narrow side of connector 3 so as to illustrate the different types of embodiments of coupling member 14. Accordingly, coupling member 14 of the connector 3 of FIG. 4 is bent away at a right angle to metal plate 1 so that the coupling direction (see arrow 7) extends parallel to the planar expanse of metal plate 1. Together with a connecting cable, not shown in FIG. 4, this results in particularly compact installation conditions.

A significant advantage of the housing according to the invention as shown in the embodiments, is the fully automatic manufacture of the housing. This makes it possible to realize a particularly economical manufacture of this housing according to the invention.

We claim:

1. A housing for installation in motor vehicles to accommodate electronic components, comprising:
   a multi-layer circuit board or a multi-layer film which, on one side, is equipped with SMD electronic components;
   a metal plate as the carrier for the multi-layer circuit board or the multi-layer film, with the planar expanse of said metal plate being greater than the planar expanse of said multi-layer circuit board or said multi-layer film, wherein the multi-layer circuit board or the multi-layer film is disposed on, attached to and insulated from the metal plate;
   power components, disposed on the surface of the metal plate in a region not covered by the multi-layer circuit board or multi-layer film, with said metal plate serving as a heat sink for said power components;
   a connector mounted on the metal plate in a further region covered by the multi-layer circuit board or the multi-layer film, such that connection pins of the connector are brought into the multi-layer circuit board or multi-layer film, and the coupling side of the connector lies on the planar side of the metal plate which is opposite the side carrying the multi-layer circuit board or multi-layer film; and
   mechanical cover means attached to the metal plate to form a flat housing, said mechanical cover means covering only the side of the metal plate carrying the multi-layer circuit board or multi-layer film.

2. A housing according to claim 1, wherein the connector is disposed in the immediate vicinity of the power components.

3. A housing according to claim 1, wherein the power components are glued to the metal plate such that the power components and the metal plate are electrically insulated and in good thermal contact.

4. A housing according to claim 1, wherein the metal plate is rectangular with a length (l) and a width (b) and the shape of the multi-layer circuit board or the multi-layer film is selected so that its length is almost the same as that of the metal plate and its width is less than that of the metal plate by such an amount that the rectangular area resulting therefrom on the metal plate is sufficient to accommodate the power components.

5. A housing according to claim 4, wherein the connector covers the entire length of the metal plate and, in order to install the housing, the connector is provided on both of its narrow end faces with flange members that project beyond the metal plate and are provided with bores.

6. A housing according to claim 1, wherein the metal plate has a passage for the connecting pins.

7. A housing according to claim 1, wherein the coupling direction of the connector is perpendicular to the metal plate.

8. A housing according to claim 1, wherein the coupling direction of the connector is parallel to the planar expanse of the metal plate.

9. A housing according to claim 1, wherein the connector is mechanically mounted on the metal plate by a fastening means to produce a tight seal.

10. A housing according to claim 1, wherein the mechanical cover means covering the electronic components is an inexpensive hood-shaped cover.

11. A housing according to claim 1, wherein the electronic components are encased by the mechanical cover means in order to cover them and protect them against moisture and corrosion.

12. A housing according to claim 11, wherein a partial or complete encasement is provided as the casing.

13. A housing according to claim 1, wherein the mechanical cover means is an encapsulation.

14. A housing for installation in motor vehicles to accommodate electronic components, comprising:
   a multi-layer film which, on one side, is equipped with SMD electronic components;
   a metal plate as the carrier for the multi-layer film, with the planar expanse of said metal plate having a similar shape and size to the planar expanse of said multi-layer film, wherein the multi-layer film is disposed on, attached to and insulated from the metal plate;
   a connector, mounted to the metal plate such that connection pins of the connector are brought through a passage in said metal plate into the multi-layer film, and a region of the multi-layer film carrying these connection pins divides the surface of the film into a first region and a second region, with the coupling side of the connector lying on the planar side of the metal plate opposite the side carrying the multi-layer film;
   power components disposed in the first region of the multi-layer film; and
   mechanical cover means attached to the metal plate to form a flat housing, with said mechanical cover means covering only the side of the metal plate carrying the multi-layer film.

15. A housing according to claim 14, wherein the power components are disposed in the immediate vicinity of the connector.

16. A housing according to claim 14, wherein the power components are soldered to the multi-layer film and are in good thermal contact with the metal plate.

17. A housing according to claim 14, wherein the metal plate and the multi-layer film are rectangular and have a length (l) and a width (b).

* * * * *